(12) United States Patent
Ali et al.

(10) Patent No.: US 8,190,109 B2
(45) Date of Patent: *May 29, 2012

(54) DYNAMIC REAL-TIME CALIBRATION FOR ANTENNA MATCHING IN A RADIO FREQUENCY TRANSMITTER SYSTEM

(75) Inventors: Shirook Ali, Waterloo (CA); James Paul Warden, Irving, TX (US); Mohamed Bakr, Hamilton (CA)

(73) Assignee: Research In Motion Limited, Waterloo (CA)

( * ) Notice: Subject to any disclaimer, the term of this patent is extended or adjusted under 35 U.S.C. 154(b) by 299 days.

This patent is subject to a terminal disclaimer.

(21) Appl. No.: 12/579,370

(22) Filed: Oct. 14, 2009

(65) Prior Publication Data

US 2011/0086601 A1  Apr. 14, 2011

(51) Int. Cl.
*H04B 1/04* (2006.01)
(52) U.S. Cl. ........................................ 455/123; 455/129
(58) Field of Classification Search .................... 455/68, 455/83, 107, 120, 129, 121, 123
See application file for complete search history.

(56) References Cited

U.S. PATENT DOCUMENTS

| | | | | |
|---|---|---|---|---|
| 3,366,883 A * | 1/1968 | Griffin et al. | ............. | 455/115.1 |
| 3,590,385 A * | 6/1971 | Sabo et al. | .................... | 455/123 |
| 5,564,086 A | 10/1996 | Cygan et al. | | |
| 5,991,282 A | 11/1999 | Langlet et al. | | |
| 6,326,922 B1 | 12/2001 | Hegendoerfer | | |
| 6,414,562 B1 | 7/2002 | Bouisse et al. | | |
| 6,788,920 B1 | 9/2004 | Zamat | | |
| 6,895,225 B1 * | 5/2005 | Talvitie et al. | .................. | 455/78 |
| 7,071,776 B2 * | 7/2006 | Forrester et al. | ............. | 330/129 |
| 7,512,384 B2 | 3/2009 | Toda et al. | | |
| 7,528,674 B2 | 5/2009 | Kato et al. | | |
| 7,586,384 B2 | 9/2009 | Ranta | | |
| 7,711,337 B2 | 5/2010 | McKinzie, III et al. | | |
| 7,831,219 B2 | 11/2010 | Heuermann et al. | | |
| 7,865,154 B2 * | 1/2011 | Mendolia et al. | ............. | 455/125 |
| 7,917,104 B2 | 3/2011 | Manssen et al. | | |
| 2003/0048223 A1 | 3/2003 | Kezys | | |
| 2003/0184319 A1 | 10/2003 | Nishimori et al. | | |
| 2004/0009754 A1 | 1/2004 | Smith | | |
| 2005/0146387 A1 | 7/2005 | Toda et al. | | |
| 2006/0025088 A1 * | 2/2006 | Pietig et al. | .................. | 455/121 |

(Continued)

OTHER PUBLICATIONS

Qiao et al., "Antenna Impedance Mismatch Measurement and Correction for Adaptive CDMA Transceivers", pp. 1-4, Microwave Symposium Digest, 2005 IEEE MTT-S International, Jun. 12-17, 2005.

(Continued)

*Primary Examiner* — Blane J Jackson
(74) *Attorney, Agent, or Firm* — Novak Druce + Quigg LLP

(57) ABSTRACT

Real-time calibration of a tunable matching network that matches the dynamic impedance of an antenna in a radio frequency transmitter system. The radio frequency transmitter system includes two non-linear equations that may be solved to determine the reflection coefficient of the antenna. The tunable matching network is repeatedly perturbed and the power reflected by the antenna is measured after each perturbation at the same node within the tunable matching network. The power values are used by an optimizer in converging to a solution that provides input impedance of the antenna. The elements of the matching circuit are adjusted to match the input impedance of the antenna.

16 Claims, 8 Drawing Sheets

U.S. PATENT DOCUMENTS

| | | | |
|---|---|---|---|
| 2006/0160501 A1* | 7/2006 | Mendolia et al. | 455/125 |
| 2007/0010217 A1 | 1/2007 | Takahashi et al. | |
| 2007/0155347 A1 | 7/2007 | Heuermann et al. | |
| 2007/0197180 A1 | 8/2007 | McKinzie et al. | |
| 2008/0180345 A1 | 7/2008 | Larson et al. | |
| 2008/0180346 A1 | 7/2008 | Rofougaran | |
| 2008/0261544 A1 | 10/2008 | Blin | |
| 2009/0011732 A1 | 1/2009 | Bayruns | |
| 2009/0066440 A1 | 3/2009 | Chan Wai Po et al. | |
| 2009/0121963 A1 | 5/2009 | Greene | |
| 2009/0157334 A1 | 6/2009 | Goodnow et al. | |
| 2009/0161586 A1 | 6/2009 | Kasai et al. | |
| 2009/0289735 A1 | 11/2009 | Womac | |
| 2011/0086600 A1* | 4/2011 | Muhammad | 455/120 |
| 2011/0163935 A1 | 7/2011 | de Jongh et al. | |

OTHER PUBLICATIONS

Parfitt et al., "The Design of Active Receiving Antennas for Broadband Low-Noise Operation", pp. 1-4 www.ursi.org/Proceedings/ProcGA02/papers/p1001.pdf.

Oh et al., "Automatic antenna-tuning unit for software-defined and cognitive radio", Wireless Communications and Mobile Computing, Wiley InterScience, 2007, pp. 1-13.

Toftgard et al., "Effects on Portable Antennas of the Presence of a Person", IEEE Transactions on antennas and Propagation, vol. 41, No. 6, Jun. 1993, pp. 739-746.

Ogawa et al., "An Analysis of the Performance of a Handset Diversity Antenna Influenced by Head, Hand, and Shoulder Effects at 900 MHz: Part I—Effective Gain Characteristics", IEEE Transactions on Vehicular Technology, vol. 50, No. 3, May 2001, pp. 830-844.

de Mingo et al., "An RF Electronically Controlled Impedance Tuning Network Design and Its Application to an Antenna Input Impedance Automatic Matching System", IEEE Transactions on Microwave Theory and Techniques, vol. 52, No. 2, Feb. 2004, pp. 489-497.

"WiSpry Programmable RF Silicon Solutions", WiSpry, 2009, 1 page, retrieved Sep. 16, 2009, http://www.wispry.com.

"Adaptive RF: Iconic Phones with No Compromises", Paratek, 1 page, retrieved Sep. 16, 2009 http://www.paratek.com.

Pozar, "Microwave Engineering", 1990, Addison-Wesley Publishing Company, Table of Contents, pp. 1-12.

International Search Report and Written Opinion for PCT Application No. PCT/US2010/052648, mailed Jan. 24, 2011.

International Preliminary Report on Patentability for PCT Application No. PCT/US2010/52648, mailed Dec. 23, 2011.

International Search Report and Written Opinion for PCT Application No. PCT/US2010/052651, mailed Sep. 30, 2011.

Vian, James, Double-Stub Impedance Matching Algorithm, Antennas and Propagation International Symposium, IEEE, Jun. 1, 2007.

Press, William H. et al., Numerical Recipes in C, The Art of Scientific Computing, Feb. 1, 1993.

Oba, H. et al., Adaptive Impedance Matching System Using FPGA Processor for Efficient Control Algorithm, IEICE Transactions on Electronics, Electronics Society, Tokyo, Japan, vol. E91C, No. 8, Aug. 1, 2008.

De Mingo, Jesus et al., An RF Electronically Controlled Impedance Tuning Network Design and Its Application to an Antenna Input Impedance Automatic Matching System, IEEE Transactions on Microwave Theory and Techniques, vol. 52, No. 2, Feb. 1, 2004.

* cited by examiner

DYNAMIC REAL-TIME CALIBRATION FOR ANTENNA MATCHING IN A RADIO FREQUENCY TRANSMITTER SYSTEM

CROSS-REFERENCE TO RELATED APPLICATIONS

This application is related to U.S. patent application Ser. No. 12/579,381, entitled Dynamic Real-Time Calibration for Antenna Matching in a Radio Frequency Receiver System, to Ali et al. filed on even date herewith, and which is herein incorporated by reference for all purposes.

BACKGROUND

1. Technical Field

This disclosure relates to wireless communications systems and more specifically to the design and implementation of an adaptive wireless radio frequency transmitter system that dynamically matches, in real-time, the impedance of an antenna.

2. Description of the Related Art

The reliability and efficiency of wireless communication systems are often affected by the environment in which the communications occur. For example, objects in the near field environment, or within a close proximity of an antenna, such as, but not limited to, human objects, metal objects, and buildings may reduce the level of electromagnetic energy radiated by the antenna. These objects may include, for example, without limitation, a human or other such biological object, a metal object, an aircraft, a tree, a building, and other such objects or a combination of objects. The reduced radiation of electromagnetic energy results in a high percentage of power being reflected back to a radio frequency transmitter. The amount of power reflected is an indicator of the degree of impedance mismatch between the antenna and the radio frequency transmitter.

Transceiver circuits, and in particular, transmitter circuits, may increase the power transmitted by an antenna and decrease the reflected power by predicting the types of environment in which a wireless communication system may be used. The transmitter circuits may then be preset to specific values which will reduce the reflective power of the transmitter circuit within the predetermined environment.

BRIEF DESCRIPTION OF THE DRAWINGS

For a better understanding of the disclosure and the various embodiments described herein, reference is now made to the following brief description, taken in connection with the accompanying drawings and detailed description, which show at least one exemplary embodiment.

DETAILED DESCRIPTION

Figure 1:
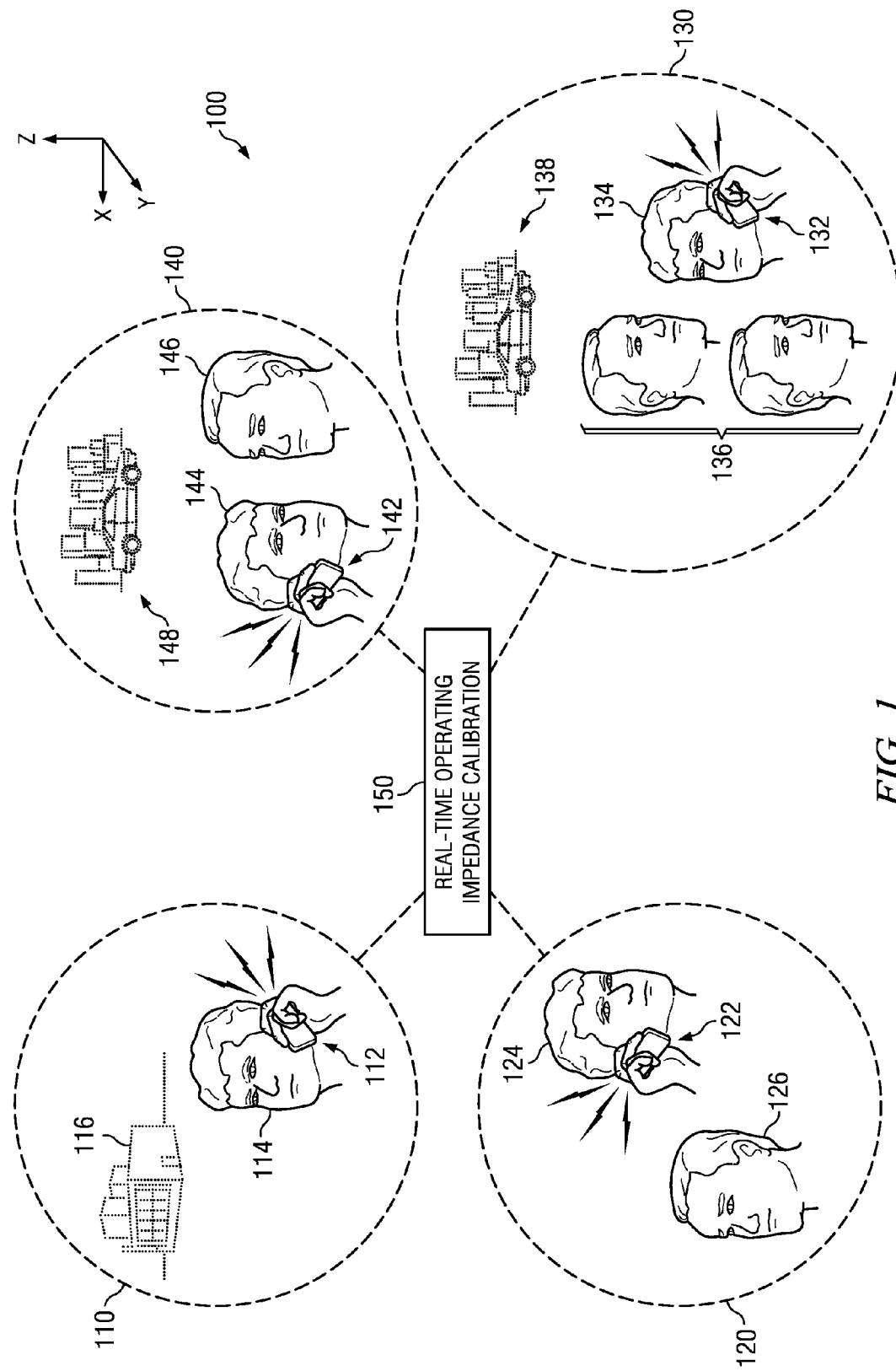
FIG. 1 illustrates a block diagram of a number of different environments in which illustrative embodiments of the disclosure may operate.

It should be understood at the outset that although an illustrative implementation of one or more embodiments are provided below, the description is not to be considered as limiting the scope of the embodiments described herein. The disclosure may be implemented using any number of techniques, whether currently known or in existence. The disclosure should in no way be limited to the illustrative implementations, drawings, and techniques illustrated and described herein, which may be modified within the scope of the appended claims along with a full scope of equivalence. It should be appreciated that for simplicity and clarity of illustration, where considered appropriate, the reference numerals may be repeated among the figures to indicate corresponding or analogous elements.

According to one illustrative embodiment, a wireless communications system comprises an antenna, a control system that calculates, in real-time, values of tuning elements to match an input impedance of the antenna to an output impedance of a transmitter system, and a matching network that is tunable by the control system through the calculated values of the tuning elements to match the input impedance of the antenna to the output impedance of the transmitter system.

In accordance with another embodiment of the disclosure, a network server comprising a computer recordable storage medium is provided. The computer recordable storage medium of the network server comprises executable program code that is executed by a process to perform actions including solving, with a non-linear optimizer, for an input impedance of an antenna by calculating a solution to two non-linear equations, and tuning a number of reactive elements of a matching network to values that match the input impedance.

In accordance with a further embodiment of the disclosure, a computer implemented method of matching the impedance of an antenna provides actions comprising solving for the input impedance of the antenna with a non-linear optimizer by calculating a solution to two non-linear equations, and tuning a number of reactive elements of a matching network, with a controller, to values that match the input impedance of the antenna to an output impedance of a transmitter system.

The present disclosure provides a tunable matching network in a radio frequency transmitter system that reduces the reflective power of the transmitter and may be varied to match, in real-time, the impedance of an antenna that is changing dynamically in response to various environmental scenarios. "Dynamic" as used in this disclosure, means adaptive or continuous changes responsive to a particular event or situation. In this application, "dynamic" refers to continuous changes in reaction to the environment or surroundings. The exact environmental variables that affect the antenna operation are not known or predictable.

The tunable matching network includes reactive components or elements which may vary in value depending on the voltage applied. During operation of the wireless communication system, a control system calibrates the voltages in the tunable matching network to exactly match the impedance of the antenna and reduce or eliminate the power reflected back to the transmitter circuit. A reflected power value of zero would mean that the power transmitted from the transmitter network is at a maximum. As used within this disclosure, "real-time" refers to a continuous or on-going processing of information without delay during the operation of hardware, software, or hardware and software. For example, a device or other hardware, software, or hardware/software combination is not considered to be operating in real-time when it is turned off, in a low power mode, sleep mode, or a standby mode.

Turning now to FIG. 1, number of environmental scenarios 100 that may affect the power transmitted by an antenna is illustrated. Number of environmental scenarios 100 is not limited to the number of scenarios depicted. Further, as used in this disclosure, "a number of" refers to one or more items. Scenarios 110, 120, 130, and 140 illustrate environmental factors that may cause an antenna of a transmission system to become detuned. In one embodiment, the transmission system may be represented by a mobile device.

In scenario 110, antenna 112 of a mobile device may be detuned by the presence of body 114, or an inanimate object, such as building 116. There may be other objects in close proximity to the antenna that cause the antenna to detune. For example, in transmission mode, antenna 112 radiates electromagnetic power. However, a mismatch between antenna 112 and the transmitter within the transmitter system of a wireless communication system may cause a significant amount of power to be reflected back to the transmitter rather than radiated through the antenna. The presence of bodies, biological or inanimate, will also cause the input impedance of the antenna, such as antenna 112, to change.

Environmental scenario 120 provides an illustration of an environmental factor within the proximity of antenna 122. Environmental scenario 120, body 124, and body 126 represent objects that may affect a change in the impedance of antenna 122. A different configuration of an environment near an antenna, including antenna 122, may detune the antenna and cause the input impedance of the antenna to change. Environmental scenario 130 provides another illustration of environmental factors within a near field proximity of an antenna, such as antenna 132. The environmental factors may include, but are in no way limited to, biological objects, such as a body 134 in close contact with the antenna, or bodies 136, and inanimate objects, such as object 138.

Environmental scenario 140 includes body 144 and body 146 in close proximity to antenna 142 and may cause the detuning of antenna 142 alone or in conjunction with object 148. The number and types of objects depicted by environmental scenarios 110, 120, 130, and 140 that may be within close proximity or the near field of an antenna in a wireless communication system or device, such as antenna 112, 122, 132, and 142, is in no way limited to the number of configurations depicted. Real-time operating impedance calibration 150 operates to calibrate reactive elements of a matching network within the transmitter system in real-time so that the power transmitted by the antenna remains at a maximum and the input impedance of the antenna is continually matched.

Figure 2:
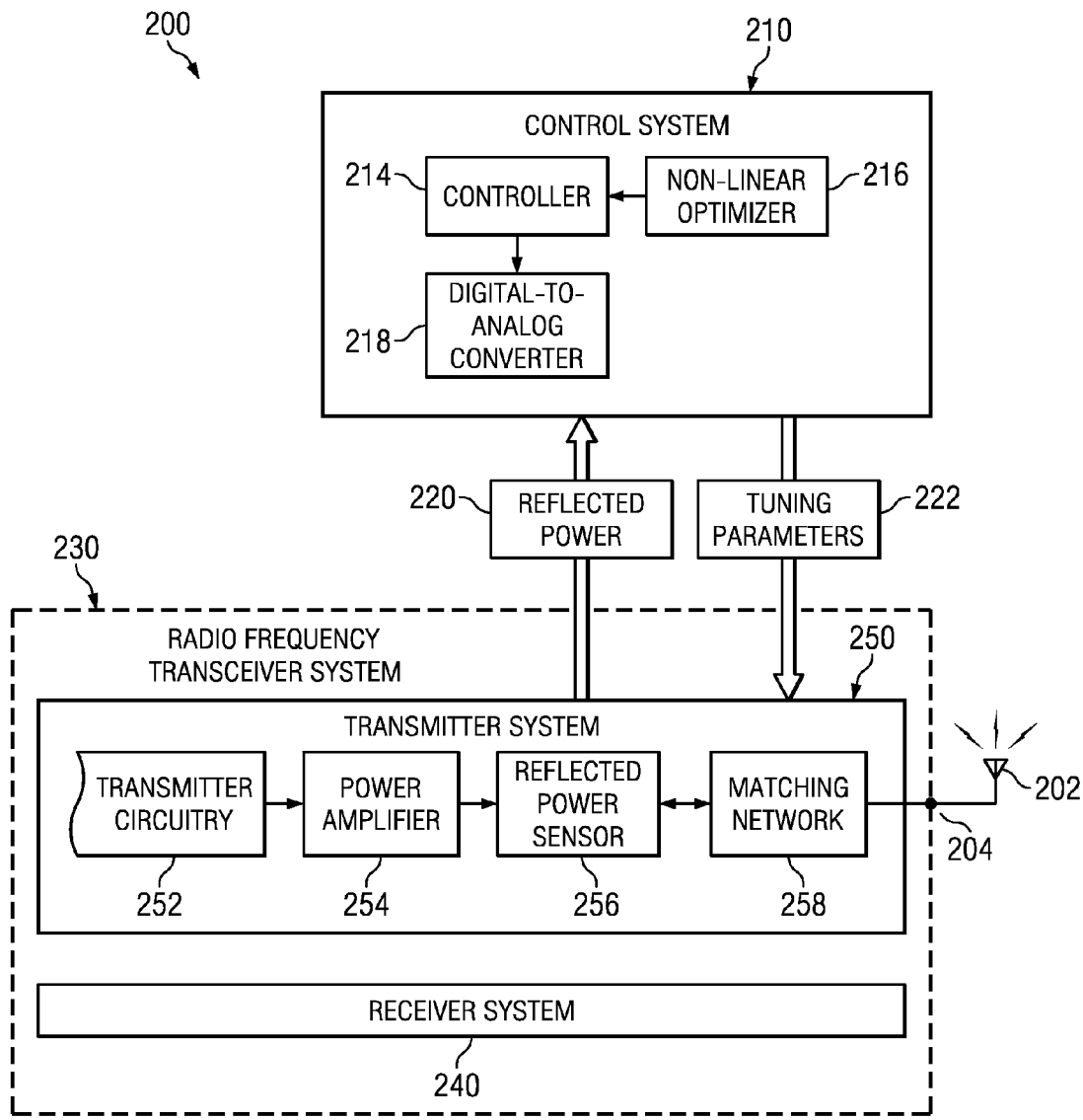
FIG. 2 illustrates a top level block diagram of a communications system detailing the transmitter system in accordance with an illustrative embodiment of the disclosure.

FIG. 2 illustrates a top level diagram of wireless communications system 200 that details the transmitter system in accordance with an embodiment of the disclosure.

In one embodiment, wireless communications system 200 includes radio frequency transceiver system 230, control system 210, and antenna 202. Radio frequency transceiver system 230 comprises receiver system 240 and transmitter system 250. Antenna 202 is communicatively coupled to radio frequency transceiver system 230 through antenna feedpoint 204. In a transmitting mode, antenna 202 radiates electromagnetic signals from transmitter system 250 through antenna feedpoint 204.

Matching network 258 is tunable which means that matching network 258 may be adjusted, corrected and/or changed based on specific system requirements to match the impedance of power amplifier 254 with the impedance of antenna 202. The adjustments, corrections, and/or changes may vary in number, scope, and degree. For example, in one illustrative embodiment, matching network 258 may be incrementally tuned a number of times by a specific value or values within a particular tuning period. The tuning value or values are typically greater than or equal to about positive or negative thirty percent of the original tuning value. In another illustrative embodiment, the tuning of matching network 258 may be iterative within a particular tuning period.

In transmitter system 250, power amplifier 254 generates the power that transmits out of antenna 202 so that an electromagnetic signal may be sent to a base station antenna. Power amplifier 254 sends the power through matching network 258 to antenna 202. Matching network 258 may be changed to match the impedance of antenna 202 with the impedance of power amplifier 254 and the rest of transmitter circuitry 252. An exact match between the input impedance of antenna 202 and transmitter circuitry 252 results in a reduction of the amount of power being reflected by antenna 202 as may be measured by reflected power sensor 256 as compared to the amount of reflected power measured by reflected power sensor 256 when there is no match.

In one embodiment, reflected power 220 is sent by reflected power sensor 256 and measured by controller 214 in control system 210. Controller 214 uses reflected power 220 as a parameter in solving two non-linear equations for the real and imaginary values of an input impedance of the antenna. The non-linear equations are input into non-linear optimizer 216. The non-linear optimizer 216 iterates until an actual value of the input impedance of antenna 202 in a particular environmental scenario is obtained.

Digital-to-analog converter 218 converts the output obtained from the controller to analog voltage values designated as tuning parameters 222. Tuning parameters 222 may be used to vary the voltage across a number of reactive elements in matching network 258. The reactive elements of matching network 258 are adjusted by tuning parameters 222 to match the impedance of the antenna. The impedance match maximizes the power transmitted by antenna 202 by minimizing or eliminating the reflected power completely.

Figure 3:
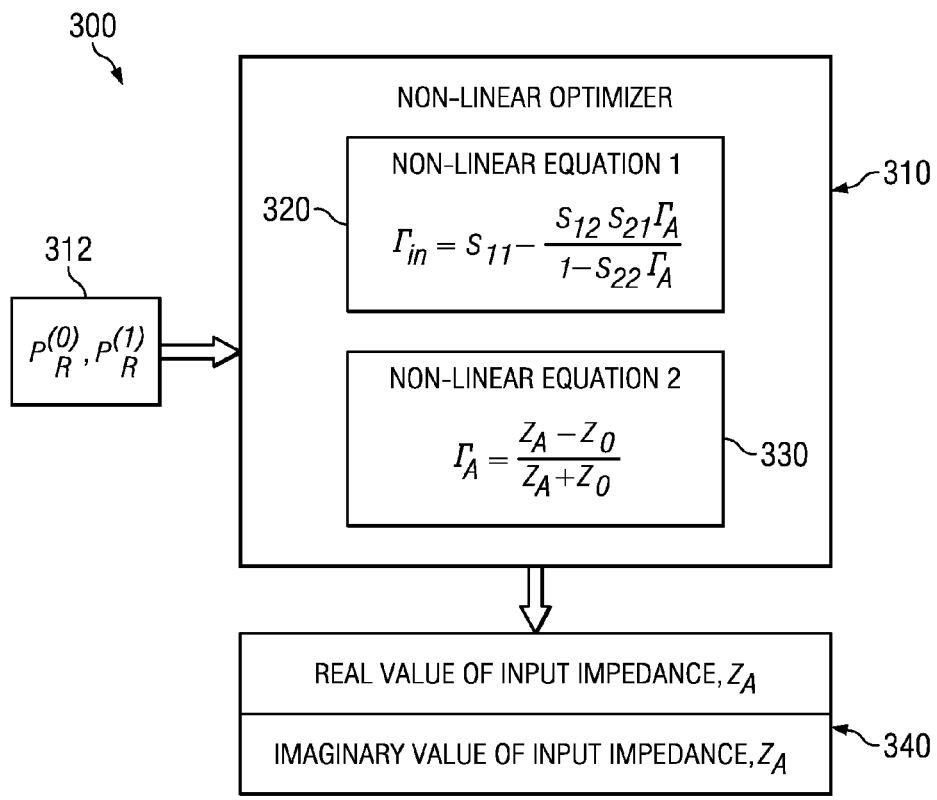
FIG. 3 illustrates a top level diagram of the input and outputs of the non-linear optimizer in accordance with an illustrative embodiment of the disclosure.

Turning now to FIG. 3, a top level representation 300 of the input and outputs of a non-linear optimizer in accordance with an illustrative embodiment of the disclosure is illustrated. In this depicted example, non-linear optimizer 310 is an example of one implementation for non-linear optimizer 216 in control system 210 of FIG. 2.

As illustrated, non-linear optimizer 310 requires two power values 312 that represent the reflected power measured by the transmitter system. Power values 312 are always measured at the same point or node within matching network 258. Non-linear optimizer 310 requires a reference reflected power value, $P_R^{(0)}$, which may be measured by a power sensor, such as reflected power sensor 256 of FIG. 2. The second power value, $P_R^{(1)}$, is determined by perturbing or varying the reactive elements of the matching circuit by a significant value. A perturbation represents an actual mathematical change or variation in value. The mathematical variation may be a positive or negative real number or percentage.

In one illustrative embodiment, a significant value may be 30 percent of the normal value of a reactive element. For example, L represents the value of an inductor in the matching network. According to this embodiment, 0.3*L would represent a 30 percent perturbation of the normal value of the inductor L. Perturbed reactive element values are then used to calculate new values for scattering matrix parameters. The power values are used by non-linear equation 1 320 and non-linear equation 2 330 in non-linear optimizer 310. Non-linear equation one 320, EQ. 1, and non-linear equation two 330, EQ. 2, are represented, respectively, as:

$$\Gamma_{in} = S_{11} - \frac{S_{12}S_{21}\Gamma_A}{1 - S_{22}\Gamma_A} \quad \text{(EQ. 1)}$$

$$\Gamma_A = \frac{Z_A - Z_0}{Z_A + Z_0} \quad \text{(EQ. 2)}$$

In non-linear equation one, the scattering parameters, or S-parameters, $S_{11}$, $S_{12}$, $S_{21}$, and $S_{22}$ are known values of the matching network. $S_{11}$ represents the input reflection coefficient of a 50 ohm terminated output. $S_{21}$ represents the forward transmission coefficient of a 50 ohm terminated output; $S_{12}$ represents the reverse transmission coefficient of a 50 ohm terminated input; and $S_{22}$ represents the output reflection coefficient of a 50 ohm terminated input. $\Gamma_{in}$ is the reflection coefficient of the antenna as seen into the matching network and $\Gamma_A$ is the reflection coefficient of the antenna.

In non-linear equation two, $\Gamma_{in}$ is the reflection coefficient of the antenna as seen into the matching network. $Z_A$ represents the input impedance of the antenna. $Z_0$ represents the reference input impedance of the antenna from a previous transmission tuning period.

Non-linear optimizer 310 starts with an estimated complex value of the impedance of an antenna, such as antenna 202 of FIG. 2. The complex value of the impedance is comprised of real and imaginary numbers. Starting with this initial estimated complex value, non-linear optimizer 310 performs a repeated or iterative processing that eventually reaches a solution or converges to a final value that represents the actual input impedance of the antenna. The solution or final value is a complex number, $Z_A$ 340, comprising a real value and imaginary value that represents the value of the input impedance of the antenna.

Figure 4:
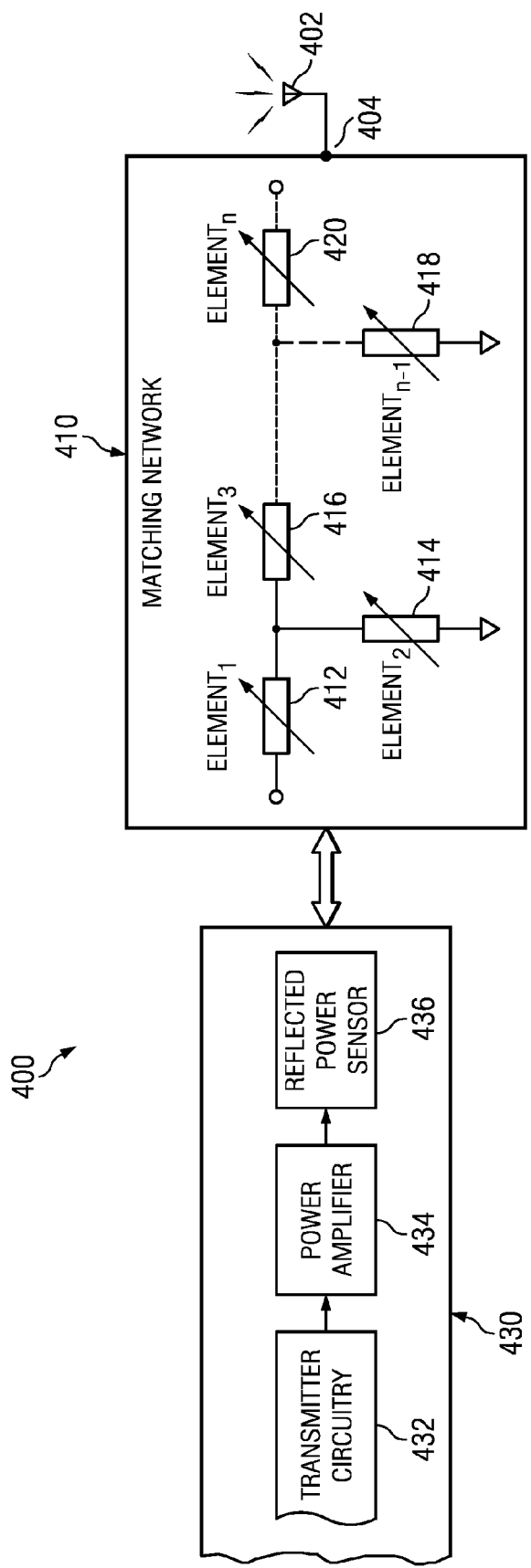
FIG. 4 illustrates a detailed view of a tunable matching network according to an illustrative embodiment of the disclosure.

FIG. 4 illustrates more detailed view 400 of a matching network according to one embodiment of the disclosure. In this depicted example, matching network 410 is an example of one implementation of matching network 252 in transmitter system 250 of FIG. 2.

As illustrated, matching network 410 includes a number of variable reactive elements, such as element$_1$ 412, element$_2$ 414, element$_3$ 416, element$_{n-1}$ 418, and element$_n$ 420. In these depicted examples, matching network 410 may include any number of variable reactive elements based on a particular embodiment as would be understood by one of ordinary skill in the art. The variable reactive elements may include capacitors, inductors, transformers, and other such reactive elements known to one skilled in the art.

The variable reactive elements of matching network 410 may be controlled individually or as one unit by analog or digital voltage values that tune the value of a particular variable reactive element within matching network 410 to correspond with an input impedance that may be calculated in real-time by a non-linear optimizer, such as non-linear optimizer 310 of FIG. 3. Antenna 402 couples to matching network 410 through antenna feedpoint 404. Matching network 410 is adapted by a control system (now shown) to match the changing impedance of antenna 402 with the impedance of reflected power sensor 436 in a portion of transmitter system 430 that also includes power amplifier 434 and transmitter circuitry 432. In one embodiment, a matching network is tuned to match the impedance of antenna 402 to the impedance of reflected power sensor 436 at 50 ohms.

Figure 5:
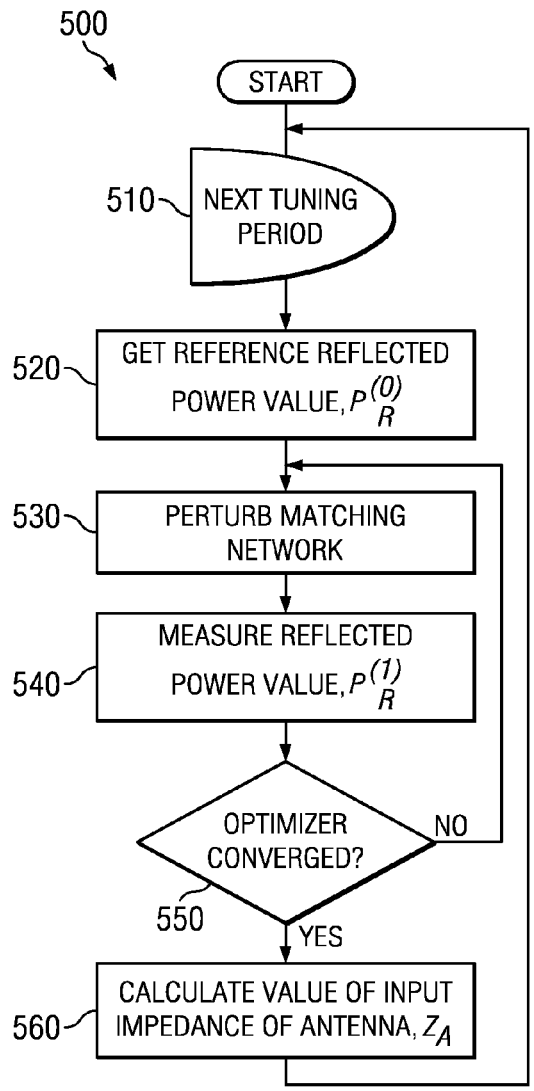
FIG. 5 illustrates a top level flowchart according to an illustrative embodiment of the disclosure.

In FIG. 5, diagram 500 illustrates a method of operation according to one embodiment of the disclosure. At block 510, the transceiver system waits for a tuning clock or the next tuning period of a transmitter clock cycle. The tuning periods are sequential which means that a second transmitter tuning period follows a first transmitter tuning period. This may also be expressed as a next transmitter tuning period following a previous transmitter tuning period. The availability of a current transmitter tuning period initiates the process. At block 520, the reference reflected power value, $P_R^{(0)}$, is input as a parameter to a non-linear equation. The reference reflected power value is used to determine scattering matrix parameters of the matching network. The elements of the matching network are perturbed to a significant percentage of normal value at block 530. In some embodiments, this significant percentage is considered to be at least 30 percent.

Scattering matrix parameters of the matching network using the perturbed element value is determined and a reflected power value, $P_R^{(1)}$, based on the value of the perturbed elements and the scattering matrix parameters with the perturbed elements is measured at block 540. The reference reflected power value, $P_R^{(0)}$, and the measured reflected power value, $P_R^{(1)}$, are input as known values into two non-linear equations that are solved through a non-linear optimizer to determine input impedance of the antenna. At block 550, it is determined whether or not the optimizer has converged to an actual solution for the input impedance of the antenna. If no convergence has been reached, the transmitter system perturbs a matching network at block 530 and measures another reflected power value based on the perturbation of the matching network at block 540. If a convergence is reached, the optimizer will eventually converge to a value that represents the actual value of the input impedance of the antenna at block 560.

Figure 6:
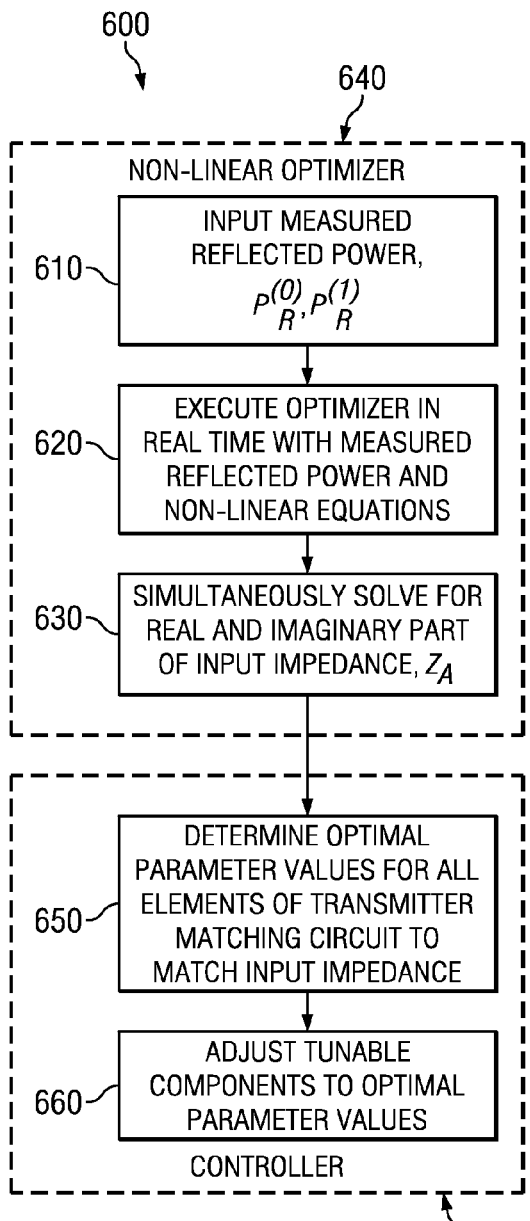
FIG. 6 illustrates a flowchart that represents further detailed operations of the non-linear optimizer according to an illustrative embodiment of the disclosure.

Turning now to FIG. 6, diagram 600 provides a more detailed flow according to an embodiment of the current disclosure. The procedures represented in block 640 may be performed by a non-linear optimizer, such as non-linear optimizer 216 in FIG. 2. Procedures in block 670 may be performed by a controller or a control system, such as controller 214 or control system 210 in FIG. 2.

Diagram 600 represents only one embodiment of the current disclosure. Other alternative embodiments that feature block 640 and block 670 performing a greater or reduced number of operations may be realized as would be obvious to one skilled in the art. Turning first to the non-linear optimizer operations as disclosed in block 640, the non-linear optimizer receives a reference reflected power value, $P_R^{(0)}$, and a measured reflected power value, $P_R^{(1)}$, as determined by the controller at block 610. At block 620, reflected power input into non-linear optimizer 640 is used as a parameter in two non-linear equations that are executed in the optimizer. At block 630 the real and imaginary values of the input impedance of the antenna, $Z_A$ is determined by simultaneously solving the non-linear equations.

Based on the value of the input impedance, $Z_A$, the optimal parameter values for all elements of the transmitter matching circuit may be determined. The tunable reactive elements of the matching circuit may then be adapted to match the input impedance of the antenna to the input impedance of the transmitter system at block 660.

Figure 7:
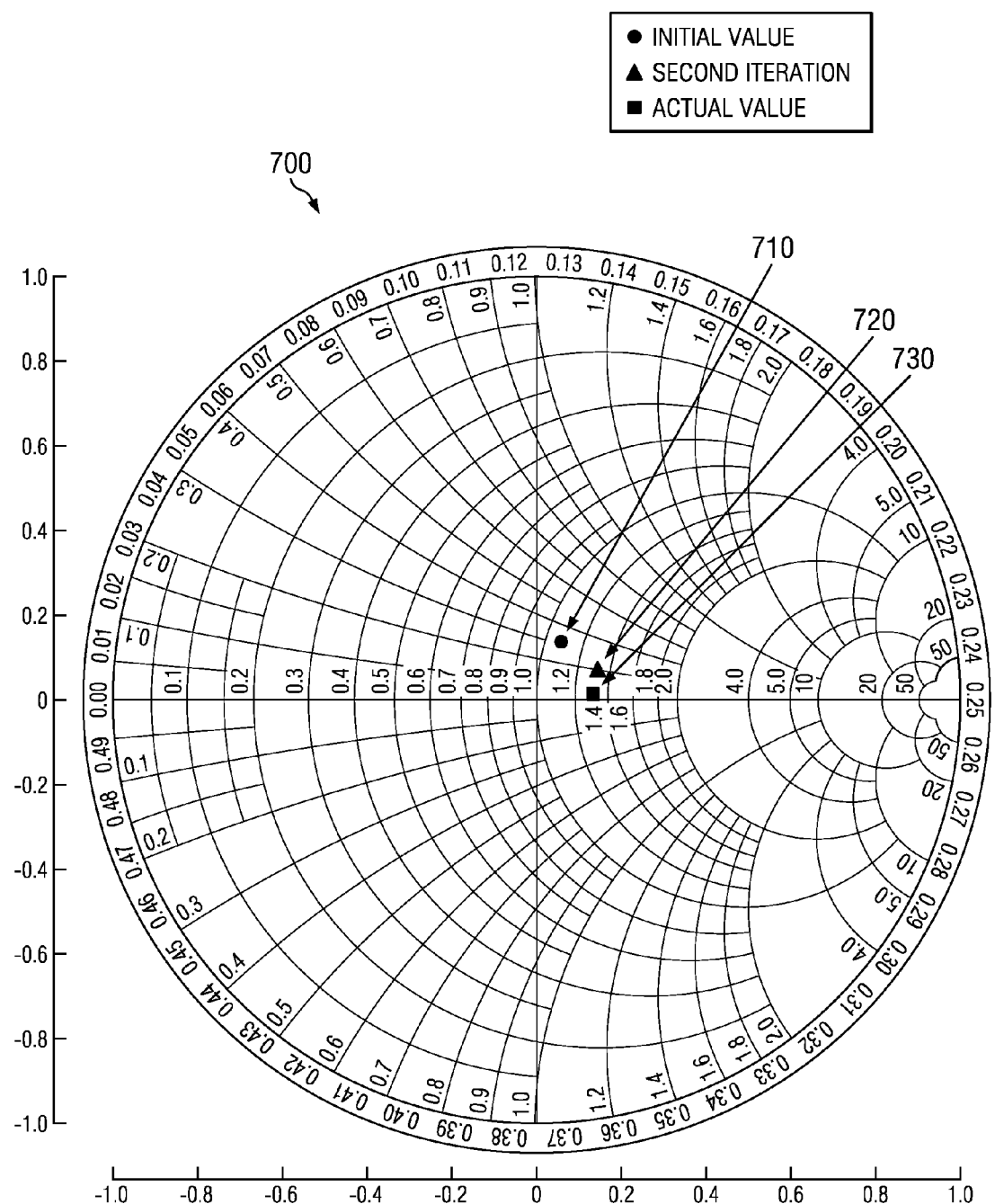
FIG. 7 illustrates a Smith chart that illustrates the convergence of the non-linear optimizer according to an illustrative embodiment of the disclosure.

In FIG. 7, Smith chart 700 illustrates a process of convergence that may be implemented by the non-linear optimizer according to one embodiment of the current disclosure. Smith chart 700 illustrates convergence of the non-linear optimizer to the actual input impedance value of the antenna within two iterations. In this specific embodiment, the initial complex value 710 input into the non-linear optimizer is 56+j11. During a first iteration, the second complex value of 67+j4 is obtained at 720. At 730, the optimizer converges on the actual input impedance value of 65+j5. In an illustrative embodiment, the actual impedance value may then be placed in an electronic look-up table to determine the configuration or values of the reactive elements of the matching circuit.

The non-linear optimizer converges fairly quickly at a quadratic convergence rate regardless of the initial value input into the non-linear optimizer. In illustrative embodiments of the disclosure, more than two iterations may be needed in order to achieve a final convergence. However, the non-linear equations disclosed earlier may be considered as complex mathematical problems that will always converge at a quadratic rate within two to three iterations of a non-linear optimizer.

Figure 8:
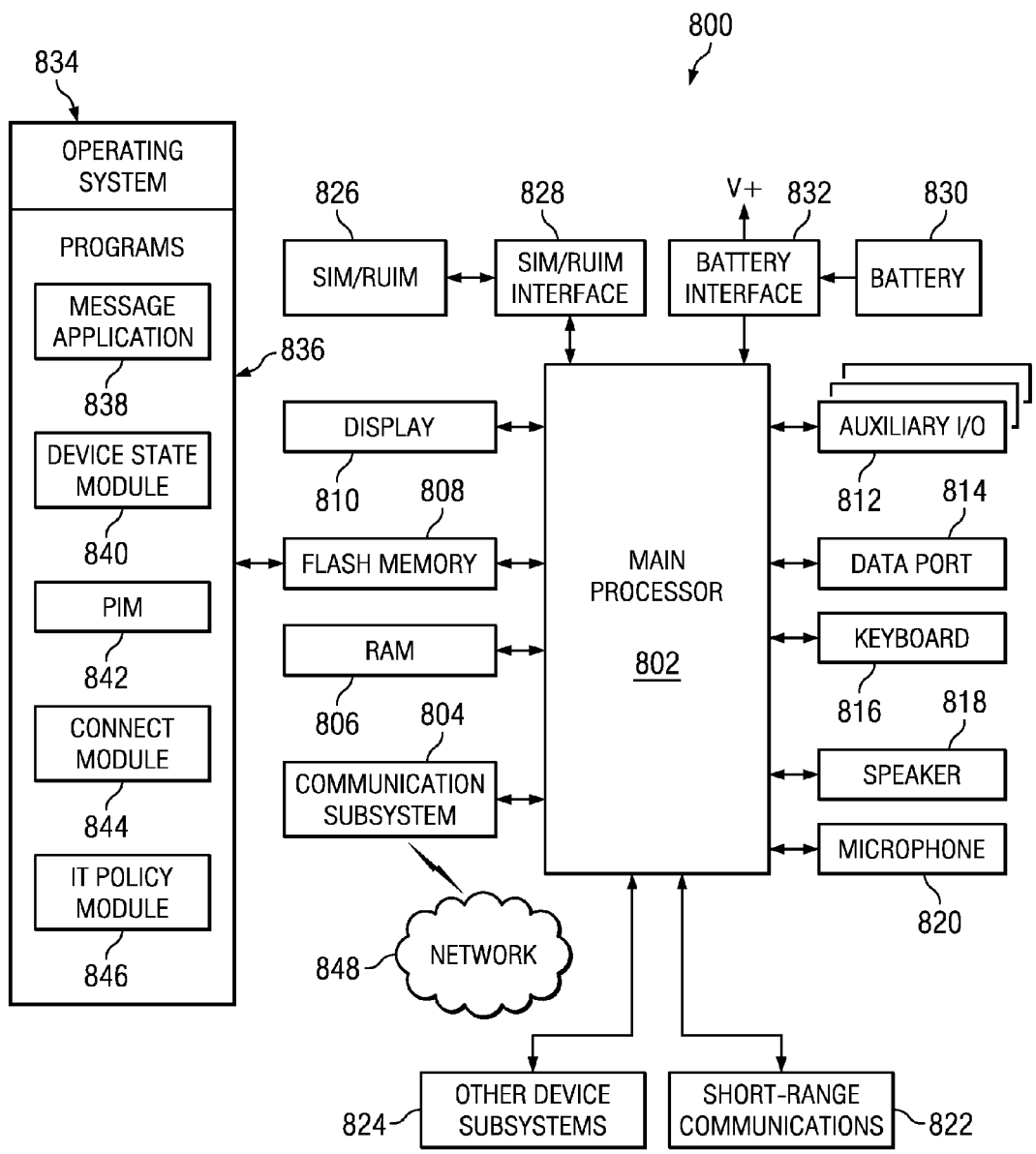
FIG. 8 illustrates a block diagram of an illustrative embodiment of a mobile device according to an illustrative embodiment of the disclosure.

Referring next to FIG. 8, shown therein is a block diagram of an illustrative embodiment of mobile device 800 according to an embodiment of the disclosure. Mobile device 800 is operable for implementing aspects of the disclosure and may include, for example, without limitation, control system 210 and radio frequency transceiver system 230, but the disclosure should not be limited to such implementations. Mobile device 800 includes a number of components, such as main processor 802 that controls the overall operation of mobile device 800. Communication functions, including data and voice communications, are performed through communication subsystem 804.

Communication subsystem 804 receives messages from and sends messages to wireless network 848. In this exemplary embodiment of mobile device 800, communication subsystem 804 is configured in accordance with the Global System for Mobile Communication (GSM) and General Packet Radio Services (GPRS) standards. The GSM/GPRS wireless network is used worldwide and it is expected that these standards will be superseded eventually by Enhanced Data GSM Environment (EDGE) and Universal Mobile Telecommunications Service (UMTS). New standards are still being defined, but it is believed that they will have similarities to the network behavior described herein, and it will also be understood by persons skilled in the art that the embodiments described herein are intended to use any other suitable standards that are developed in the future. The wireless link connecting communication subsystem 804 with wireless network 848 represents one or more different Radio Frequency (RF) channels, operating according to defined protocols specified for GSM/GPRS communications. With newer network protocols, these channels are capable of supporting both circuit switched voice communications and packet switched data communications.

Although wireless network 848 associated with mobile device 800 is a GSM/GPRS wireless network in one exemplary implementation, other wireless networks may also be associated with mobile device 800 in variant implementations. The different types of wireless networks that may be employed include, for example, data-centric wireless networks, voice-centric wireless networks, and dual-mode networks that can support both voice and data communications over the same physical base stations. Combined dual-mode networks include, but are not limited to, Code Division Multiple Access (CDMA) or CDMA2000 networks, GSM/GPRS networks (as mentioned above), and future third-generation (3G) networks like EDGE and UMTS. Some other examples of data-centric networks include WiFi 802.11, Mobitex™ and DataTAC™ network communication systems. Examples of other voice-centric data networks include Personal Communication Systems (PCS) networks like GSM and Time Division Multiple Access (TDMA) systems.

Main processor 802 also interacts with additional subsystems, such as Random Access Memory (RAM) 806, flash memory 808, display 810, auxiliary input/output (I/O) subsystem 812, data port 814, keyboard 816, speaker 818, microphone 820, short-range communications subsystem 822 and other device subsystems 824.

Some of the subsystems of mobile device 800 perform communication-related functions, whereas other subsystems may provide "resident" or on-device functions. By way of example, display 810 and keyboard 816 may be used for both communication-related functions, such as entering a text message for transmission over wireless network 848 and device-resident functions such as a calculator or task list.

Mobile device 800 can send and receive communication signals over wireless network 848 after required network registration or activation procedures have been completed. Network access is associated with a subscriber or user of mobile device 800. To identify a subscriber, mobile device 800 requires SIM/RUIM card 826 (i.e. Subscriber Identity Module or a Removable User Identity Module) to be inserted into SIM/RUIM interface 828 in order to communicate with a network. SIM/RUIM card 826 is one type of a conventional "smart card" that can be used to identify a subscriber of mobile device 800 and to personalize mobile device 800, among other things. Without SIM/RUIM card 826, mobile device 800 is not fully operational for communication with wireless network 848. By inserting SIM/RUIM card 826 into SIM/RUIM interface 828, a subscriber can access all subscribed services. Services may include: web browsing and messaging such as e-mail, voice mail, Short Message Service (SMS), and Multimedia Messaging Services (MMS). More advanced services may include: point of sale, field service and sales force automation. SIM/RUIM card 826 includes a processor and memory for storing information.

Once SIM/RUIM card 826 is inserted into SIM/RUIM interface 828, it is coupled to main processor 802. In order to identify the subscriber, SIM/RUIM card 826 can include some user parameters such as an International Mobile Subscriber Identity (IMSI). An advantage of using SIM/RUIM card 826 is that a subscriber is not necessarily bound by any single physical mobile device. SIM/RUIM card 826 may store additional subscriber information for a mobile device as well, including datebook (or calendar) information and recent call information. Alternatively, user identification information can also be programmed into flash memory 808.

Mobile device 800 is a battery-powered device and includes battery interface 832 for receiving one or more battery 830. In at least some embodiments, battery 830 can be a smart battery with an embedded microprocessor. Battery interface 832 is coupled to a regulator (not shown), which assists battery 830 in providing power V+ to mobile device 800. Although current technology makes use of a battery, future technologies such as micro fuel cells may provide the power to mobile device 800.

Mobile device 800 also includes operating system 834 and software components 836 to 846 which are described in more detail below. Operating system 834 includes programs 836, message application 838, device state module 840, PIM 842, connect module 844, and IT policy module 846 that are executed by main processor 802 and are typically stored in a persistent storage, such as flash memory 808, which may alternatively be a read-only memory (ROM) or similar storage element (not shown). Those skilled in the art will appreciate that portions of operating system 834 and software components 836 to 846, such as specific device applications, or parts thereof, may be temporarily loaded into a volatile store such as RAM 806. Other software components can also be included, as is well known to those skilled in the art.

The subset of programs 836 that control basic device operations, including data and voice communication applications, will normally be installed on mobile device 800 during its manufacture. The processes disclosed herein may be implemented by a computer implemented process in which the different illustrated actions may take the form of program code embodied on a computer recordable storage medium or device for execution by a controller or processor unit, such as main processor 802. The recordable storage medium or device may be, for example, a hard disk drive, a flash drive, a solid state disk drive, a floppy disk, a CD-ROM, DVD-ROM, or some other mechanical storage device.

Other software applications include message application 838 that can be any suitable software program that allows a user of mobile device 800 to send and receive electronic messages. Various alternatives exist for message application 838 as is well known to those skilled in the art. Messages that have been sent or received by the user are typically stored in flash memory 808 of mobile device 800 or some other suitable storage element in mobile device 800. In at least some embodiments, some of the sent and received messages may be stored remotely from mobile device 800 such as in a data storage of an associated host system that communicates with mobile device 800.

The software applications can further include device state module 840, Personal Information Manager (PIM) 842, and other suitable modules (not shown). Device state module 840 provides persistence, i.e. device state module 840 ensures that important device data is stored in persistent memory, such as flash memory 808, so that the data is not lost when mobile device 800 is turned off or loses power.

PIM 842 includes functionality for organizing and managing data items of interest to the user, such as, but not limited to, e-mail, contacts, calendar events, voice mails, appointments, and task items. A PIM application has the ability to send and receive data items via wireless network 848. PIM data items may be seamlessly integrated, synchronized, and updated via wireless network 848 with the mobile device subscriber's corresponding data items stored and/or associated with a host computer system. This functionality creates a mirrored host computer on mobile device 800 with respect to such items. This can be particularly advantageous when the host computer system is the mobile device subscriber's office computer system.

Mobile device 800 also includes connect module 844, and IT policy module 846. Connect module 844 implements the communication protocols that are required for mobile device 800 to communicate with the wireless infrastructure and any host system, such as an enterprise system, that mobile device 800 is authorized to interface with. Examples of a wireless infrastructure and an enterprise system are given in FIG. 9, which are described in more detail below.

Connect module 844 includes a set of APIs that can be integrated with mobile device 800 to allow mobile device 800 to use any number of services associated with the enterprise system. Connect module 844 allows mobile device 800 to establish an end-to-end secure, authenticated communication pipe with the host system. A subset of applications for which access is provided by connect module 844 can be used to pass IT policy commands from the host system to mobile device 800. This can be done in a wireless or wired manner. These instructions may be passed to IT policy module 846 to modify the configuration of mobile device 800. Alternatively, in some cases, the IT policy update can also be done over a wired connection.

IT policy module 846 receives IT policy data that encodes the IT policy. IT policy module 846 ensures that the IT policy data is authenticated by mobile device 800. The IT policy data may be stored in flash memory 808 in its native form. After the IT policy data is stored, a global notification can be sent by IT policy module 846 to all of the applications residing on mobile device 800. Applications for which the IT policy may be applicable may respond by reading the IT policy data to look for IT policy rules that are applicable.

IT policy module 846 can include a parser (not shown), which can be used by the applications to read the IT policy rules. In some cases, another module or application can provide the parser. Grouped IT policy rules, described in more detail below, are retrieved as byte streams, which are sent (recursively, in a sense) into the parser to determine the values of each IT policy rule defined within the grouped IT policy rule. In at least some embodiments, IT policy module 846 can determine which applications are affected by the IT policy data and send a notification to only those applications. In either of these cases, for applications that aren't running at the time of the notification, the applications can call the parser or IT policy module 846 when they are executed to determine if there are any relevant IT policy rules in the newly received IT policy data.

All applications that support rules in the IT Policy are coded to know the type of data to expect. For example, the value that is set for the "WEP User Name" IT policy rule is known to be a string; therefore the value in the IT policy data that corresponds to this rule is interpreted as a string. As another example, the setting for the "Set Maximum Password Attempts" IT policy rule is known to be an integer, and therefore the value in the IT policy data that corresponds to this rule is interpreted as such.

After the IT policy rules have been applied to the applicable applications or configuration files, IT policy module 846 sends an acknowledgement back to the host system to indicate that the IT policy data was received and successfully applied.

Other types of software applications can also be installed on mobile device 800. These software applications can be third party applications, which are added after the manufacture of the mobile device 800. Examples of third party applications include games, calculators, utilities, and program code that is executable by a processor, such as main processor 802, to implement various embodiments described in this disclosure.

The additional applications can be loaded onto mobile device 800 through at least one of wireless network 848, auxiliary I/O subsystem 812, data port 814, short-range communications subsystem 822, or any other suitable device subsystem 824. This flexibility in application installation increases the functionality of mobile device 800 and may provide enhanced on-device functions, communication-related functions, or both. For example, secure communication applications may enable electronic commerce functions and other such financial transactions to be performed using mobile device 800.

Data port 814 enables a subscriber to set preferences through an external device or software application and extends the capabilities of mobile device 800 by providing for information or software downloads to mobile device 800 other than through a wireless communication network. The alternate download path may, for example, be used to load an encryption key onto mobile device 800 through a direct and thus reliable and trusted connection to provide secure device communication.

Data port 814 can be any suitable port that enables data communication between mobile device 800 and another computing device. Data port 814 can be a serial or a parallel port. In some instances, data port 814 can be a USB port that includes data lines for data transfer and a supply line that can provide a charging current to charge battery 830 of mobile device 800.

Short-range communications subsystem 822 provides for communication between mobile device 800 and different systems or devices, without the use of wireless network 848. For example, short-range communications subsystem 822 may include an infrared device and associated circuits and components for short-range communication. Examples of short-range communication standards include standards developed by the Infrared Data Association (IrDA), Bluetooth, and the 802.11 family of standards developed by IEEE.

In use, a received signal such as a text message, an e-mail message, or web page download will be processed by communication subsystem 804 and input to main processor 802. Main processor 802 will then process the received signal for output to display 810 or alternatively to auxiliary I/O subsystem 812. A subscriber may also compose data items, such as e-mail messages, for example, using keyboard 816 in conjunction with display 810 and possibly auxiliary I/O subsystem 812. Auxiliary I/O subsystem 812 may include devices such as: a touch screen, mouse, track ball, infrared fingerprint detector, or a roller wheel with dynamic button pressing capability. Keyboard 816 is preferably an alphanumeric keyboard and/or telephone-type keypad. However, other types of keyboards may also be used. A composed item may be transmitted over wireless network 848 through communication subsystem 804.

For voice communications, the overall operation of mobile device 800 is substantially similar, except that the received signals are output to speaker 818, and signals for transmission are generated by microphone 820. Alternative voice or audio I/O subsystems, such as a voice message recording subsystem, can also be implemented on mobile device 800. Although voice or audio signal output is accomplished primarily through speaker 818, display 810 can also be used to provide additional information such as the identity of a calling party, duration of a voice call, or other voice call related information.

Figure 9:
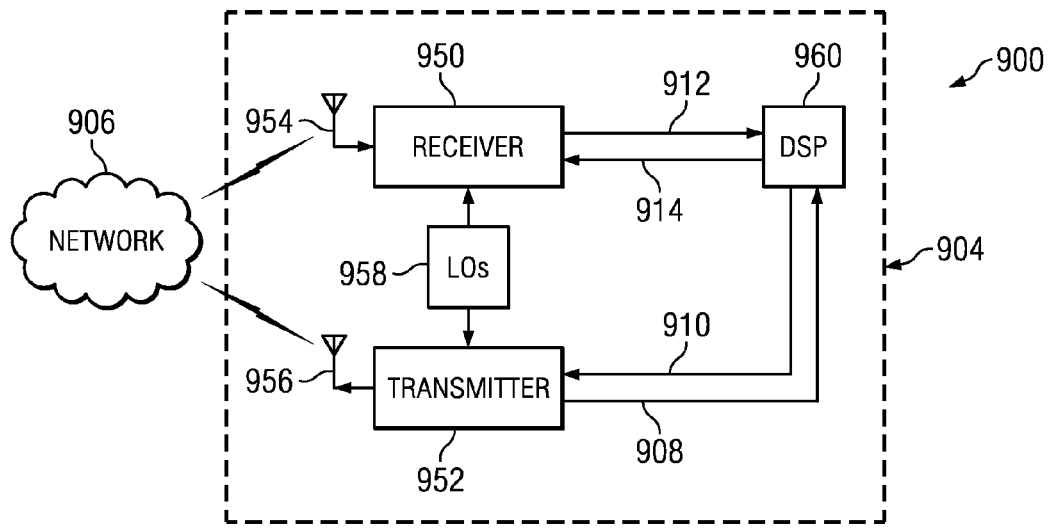
FIG. 9 illustrates a block diagram of an illustrative embodiment of a communication subsystem component of the mobile device of FIG. 8.

Referring now to FIG. 9, illustrative block diagram 900 of communication subsystem 904 is shown. Communication subsystem 904 includes receiver 950, transmitter 952, as well as associated components such as one or more embedded or internal antenna elements 954 and 956, Local Oscillators (LOs) 958, and a processing module such as Digital Signal Processor (DSP) 960. In an illustrative embodiment, receiver 950 and transmitter 952 may be part of a single transceiver unit, such as radio frequency transceiver system 230 illustrated in FIG. 2. The particular design of communication subsystem 904 is dependent upon wireless network 906 with which mobile device 800 in FIG. 8 is intended to operate. Other applicable communication devices include, but are in no way limited to, pagers, cellular phones, cellular smartphones, wireless organizers, and handheld wireless communication devices. Thus, it should be understood that the design illustrated in FIG. 9 serves only as one example.

Signals received by antenna element 954 through wireless network 906 are input to receiver 950, which may perform such common receiver functions as signal amplification, frequency down conversion, filtering, channel selection, and analog-to-digital (A/D) conversion. A/D conversion of a received signal allows more complex communication functions such as demodulation and decoding to be performed in DSP 960. In a similar manner, signals 912 to be transmitted are processed, including modulation and encoding, by DSP 960. These DSP-processed signals 910 are input to transmitter 952 for digital-to-analog (D/A) conversion, frequency up conversion, filtering, amplification and transmission over wireless network 906 via antenna element 954. DSP 960 not only processes communication signals 910, but also provides for receiver control through control signals 914 and transmitter control through control signals 908. For example, the gains applied to communication signals in receiver 950 and transmitter 952 may be adaptively controlled through automatic gain control algorithms implemented in DSP 960.

The wireless link between mobile device 800 in FIG. 8 and wireless network 906 can contain one or more different channels, typically different RF channels, and associated protocols used between mobile device 800 in FIG. 8 and wireless network 848. An RF channel is a limited resource that must be conserved, typically due to limits in overall bandwidth and limited battery power of mobile device 800 in FIG. 8.

When mobile device 800 in FIG. 8 is fully operational, transmitter 952 is typically keyed or turned on only when it is transmitting to wireless network 906 and is otherwise turned off to conserve resources. Similarly, receiver 950 is periodically turned off to conserve power until it is needed to receive signals or information (if at all) during designated time periods.

Figure 10:
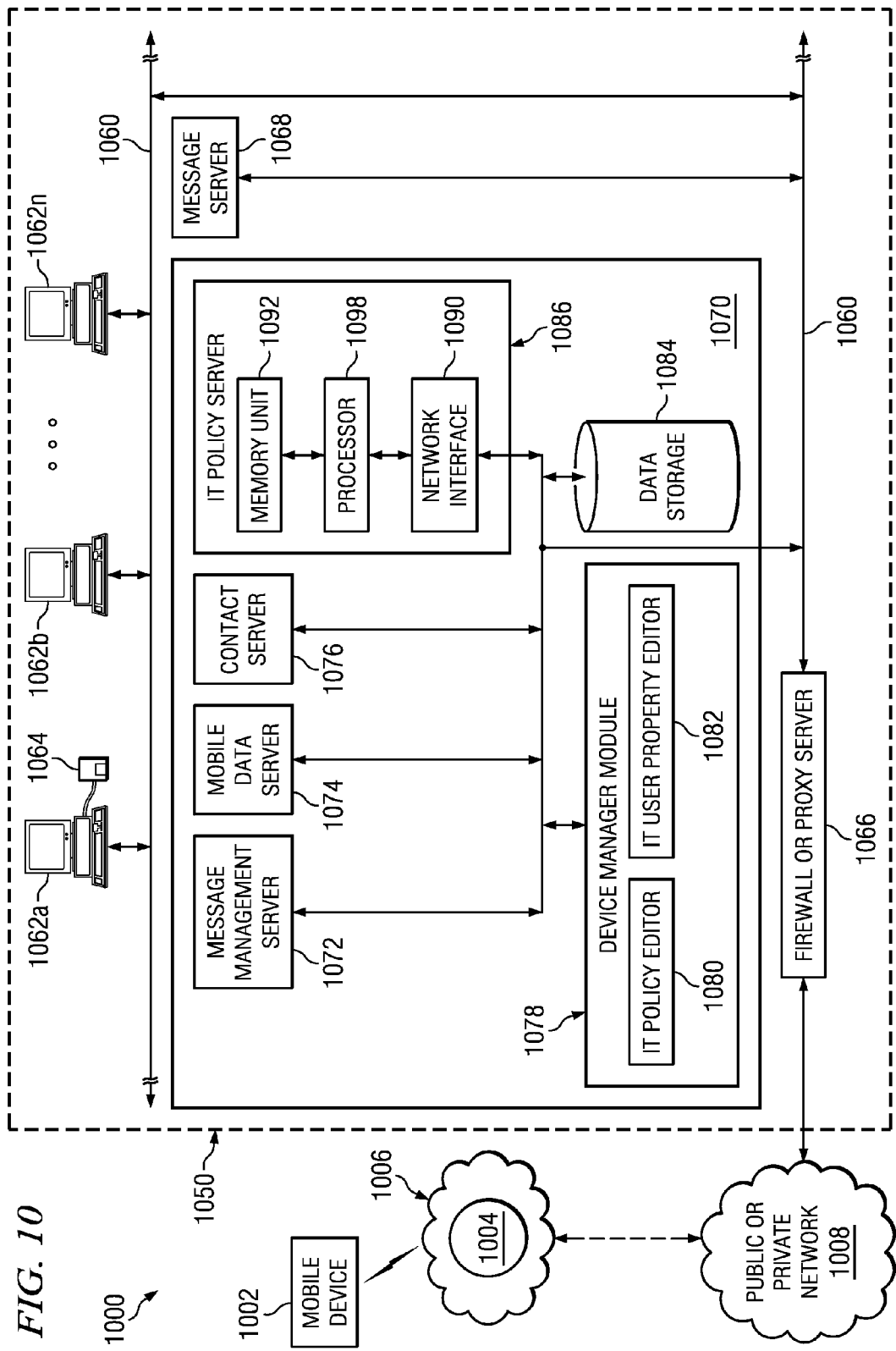
FIG. 10 illustrates a block diagram illustrating components of a host system in one illustrative configuration for use with the mobile device of FIG. 8.

Referring now to FIG. 10, shown therein is block diagram 1000 illustrating components of an exemplary configuration of host system 1050 that mobile device 1002 can communicate with in conjunction with connect module 844 of mobile device 800 in FIG. 8. Host system 1050 will typically be a corporate enterprise or other local area network (LAN), but may also be a home office computer or some other private system, for example, in variant implementations. In another illustrative embodiment, host system 1050 may be a network server comprising a computer recordable storage medium, such as memory unit 1092, described herein later, that stores instructions and other information. In the illustrative example of FIG. 10, host system 1050 is depicted as a local area network or LAN of an organization to which a user of mobile device 1002 belongs. Typically, a plurality of mobile devices can communicate wirelessly with host system 1050 through one or more nodes 1004 of wireless network 1006.

Host system 1050 comprises a number of network components connected to each other by network 1060. For instance, user computer 1062a with accompanying cradle 1064 for the user's mobile device 1002 is situated on a LAN connection. Cradle 1064 for mobile device 1002 can be coupled to computer 1062a by a serial or a Universal Serial Bus (USB) connection, for example. Other user computers 1062b-1062n are also situated on network 1060, and each may or may not be equipped with accompanying cradle 1064. Cradle 1064 facilitates the loading of information (e.g. PIM data, private symmetric encryption keys to facilitate secure communications) from user computer 1062a to mobile device 1002, and may be particularly useful for bulk information updates often performed in initializing mobile device 1002 for use. The information downloaded to mobile device 1002 may include certificates used in the exchange of messages.

It will be understood by persons skilled in the art that user computers 1062a-1062n will typically also be connected to other peripheral devices, such as printers, etc., which are not explicitly shown in FIG. 10. Furthermore, only a subset of network components of host system 1050 are shown in FIG. 10 for ease of exposition, and it will be understood by persons skilled in the art that host system 1050 will comprise additional components that are not explicitly shown in FIG. 10 for this exemplary configuration. More generally, host system 1050 may represent a smaller part of a larger network (not shown) of the organization, and may comprise different components and/or be arranged in different topologies than that shown in the exemplary embodiment of FIG. 10.

To facilitate the operation of mobile device 1002 and the wireless communication of messages and message-related data between mobile device 1002 and components of host system 1050, a number of wireless communication support components 1070 may be provided. In some implementations, wireless communication support components 1070 can include message management server 1072, mobile data server 1074, contact server 1076, and device manager module 1078. Device manager module 1078 includes IT Policy editor 1080 and IT user property editor 1082, as well as other software components for allowing an IT administrator to configure mobile device 1002. In an alternative embodiment, there may be one editor that provides the functionality of both IT policy editor 1080 and IT user property editor 1082.

Support components 1070 also include data storage 1084 and IT policy server 1086. IT policy server 1086 includes processor 1098, network interface 1090 and memory unit 1092. Processor 1098 controls the operation of IT policy server 1086 and executes functions related to the standardized IT policy as described below. Network interface 1090 allows IT policy server 1086 to communicate with the various components of host system 1050 and mobile device 1002. Memory unit 1092 can store functions used in implementing the IT policy as well as related data. Those skilled in the art know how to implement these various components. Other components may also be included as is well known to those skilled in the art. Further, in some implementations, data storage 1084 can be part of any one of the servers.

In this exemplary embodiment, mobile device 1002 communicates with host system 1050 through node 1004 of wireless network 1006 and public or private network 1008 such as a service provider network or the public Internet. Access to host system 1050 may be provided through one or more routers (not shown), and computing devices of host system 1050 may operate from behind firewall or proxy server 1066. Firewall or proxy server 1066 provides a secure node and a wireless internet gateway for host system 1050. Firewall or proxy server 1066 intelligently routes data to the correct destination server within host system 1050.

In some implementations, host system 1050 can include a wireless VPN router (not shown) to facilitate data exchange between host system 1050 and mobile device 1002. The wireless VPN router allows a VPN connection to be established directly through a specific wireless network to mobile device 1002. The wireless VPN router can be used with the Internet Protocol (IP) Version 6 (IPV6) and IP-based wireless networks. This protocol can provide enough IP addresses so that each mobile device has a dedicated IP address, making it possible to push information to a mobile device at any time. An advantage of using a wireless VPN router is that it can be an off-the-shelf VPN component, and does not require a separate wireless gateway and separate wireless infrastructure. A VPN connection can preferably be a Transmission Control Protocol (TCP)/IP or User Datagram Protocol (UDP)/IP connection for delivering the messages directly to mobile device 1002 in this alternative implementation.

Message management server 1072 can be used to specifically provide support for the management of messages, such as e-mail messages, that are to be handled by mobile devices. Generally, while messages are still stored on message server 1068, message management server 1072 can be used to control when, if, and how messages are sent to mobile device 1002. Message management server 1072 also facilitates the handling of messages composed on mobile device 1002, which are sent to message server 1068 for subsequent delivery.

Message management server 1072 may also be adapted to provide other control functions, such as only pushing certain message information or pre-defined portions or blocks of a message stored on message server 1068 to mobile device 1002. For example, in some cases, when a message is initially retrieved by mobile device 1002 from message server 1068, message management server 1072 may push only the first part of a message to mobile device 1002, with the part being of a pre-defined size. In the illustrative examples, the predefined size may be, for example, 2 Kilobytes (KB). The user can then request that more of the message be delivered in similar-sized blocks by message management server 1072 to mobile device 1002, possibly up to a maximum pre-defined message size. Accordingly, message management server 1072 facilitates better control over the type of data and the amount of data that is communicated to mobile device 1002, and can help to minimize potential waste of bandwidth or other resources.

Mobile data server 1074 encompasses any other server that stores information that is relevant to the corporation. Mobile data server 1074 may include, but is not limited to, databases, online data document repositories, customer relationship management (CRM) systems, or enterprise resource planning (ERP) applications.

Contact server 1076 can provide information for a list of contacts for the user in a similar fashion as the address book on mobile device 1002. Accordingly, for a given contact, contact server 1076 can include the name, phone number, work address and e-mail address of the contact, among other information. Contact server 1076 can also provide a global address list that contains the contact information for all of the contacts associated with host system 1050.

It will be understood by persons skilled in the art that message management server 1072, mobile data server 1074, contact server 1076, device manager module 1078, data storage 1084 and IT policy server 1086 do not need to be implemented on separate physical servers within host system 1050. For example, some or all of the functions associated with message management server 1072 may be integrated with message server 1068, or some other server in host system 1050. Alternatively, host system 1050 may comprise multiple message management servers 1072, particularly in variant implementations where a large number of mobile devices need to be supported.

Alternatively, in some embodiments, IT policy server 1086 can provide IT policy editor 1080, IT user property editor 1082 and data storage 1084. In some cases, IT policy server 1086 can also provide device manager module 1078. Processor 1098 of IT policy server 1086 can be used to perform the various steps of a method for providing IT policy data that is customizable on a per-user basis. Processor 1098 can execute IT policy editor 1080 and IT user property editor 1082. In some cases, the functionality of IT policy editor 1080 and IT user property editor 1082 can be provided by a single editor. In some cases, memory unit 1092 can provide data storage 1084.

Device manager module 1078 provides an IT administrator with a graphical user interface with which the IT administrator interacts to configure various settings for the mobile devices. As mentioned, the IT administrator can use IT policy rules to define behaviors of certain applications on mobile device 1002 that are permitted such as phone, web browser or Instant Messenger use. The IT policy rules can also be used to set specific values for configuration settings that an organization requires on the mobile devices such as auto signature text, WLAN/VoIP/VPN configuration, security requirements (e.g. encryption algorithms, password rules, etc.), specifying themes or applications that are allowed to run on mobile device 1002.

In this manner, one or more of the illustrative embodiments of the present disclosure maximizes the power transmitted and minimizes the power reflected from the matching network through adjusting or tuning the values of the reactive elements in the matching network in real-time. Additionally, the battery life of the wireless device is improved since obtaining an optimum impedance match reduces the amount of operating power dissipated. Another advantage realizes signal transmission over a wide range of frequencies with reduced noise and distortion.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein.

The embodiment or embodiments selected are chosen and described in order to best explain the principles of the embodiments, the practical application, and to enable others of ordinary skill in the art to understand the disclosure for various embodiments with various modifications as are suited to the particular use contemplated. For example, the various elements or components may be combined or integrated in another system or certain features may be omitted or not implemented.

Also, techniques, systems, and subsystems, described and illustrated in the various embodiments as discrete or separate, may be combined or integrated with other systems, modules, or techniques without departing from the scope of the present disclosure. Other items shown or discussed as coupled or directly coupled or communicating with each other may be indirectly coupled or communicated through some other interface, device or intermediate component whether electrically, mechanically, or otherwise. Other examples of changes, substitutions, and alterations are ascertainable by one skilled in the art and could be made without departing from the spirit and scope disclosed herein.

What is claimed is:

1. A wireless communications system comprising:
   an antenna;
   a control system that calculates, in real-time, values of tuning elements to match an input impedance of the antenna to an output impedance of a transmitter system, wherein the control system comprises:
      a controller configured to execute code that calculates values of the input impedance; and
      a non-linear optimizer that converges to an actual value of the input impedance of the antenna by calculating solutions to first and second non-linear equations;

wherein the first non-linear equation is expressed as:

$$\Gamma_{in} = S_{11} - \frac{S_{12} S_{21} \Gamma_A}{1 - S_{22} \Gamma_A}$$

wherein $\Gamma_{in}$ is the reflection coefficient of the antenna seen into the matching network, $\Gamma_A$ is the reflection coefficient of the antenna; $S_{11}$ is the input reflection coefficient of a 50 ohm terminated output; $S_{21}$ is the forward transmission coefficient of a 50 ohm terminated output; $S_{12}$ is the reverse transmission coefficient of a 50 ohm terminated input; and $S_{22}$ is the output reflection coefficient of a 50 ohm terminated input; and
   a matching network that is tunable by the control system through the calculated values of the tuning elements to match the input impedance of the antenna to the output impedance of the transmitter system.

2. The wireless communications system of claim 1, wherein the non-linear optimizer inputs a reference reflected power value and a first reflected power value to the first non-linear equation and to a second non-linear equation to determine the input impedance of the antenna.

3. The wireless communications system of claim 2, wherein the reference reflected power value and the first reflected power value are measured at a specific node of the matching network.

4. The wireless communications system of claim 2, wherein the first reflected power value is the power measured from the transmitter system after a first perturbation of a number of reactive elements in the matching network.

5. The wireless communications system of claim 4, further comprising:
   a digital-to-analog converter that converts the input impedance of the antenna to a number of voltage values that tune the reactive elements of the matching network.

6. The wireless communications system of claim 1, further comprising:
   computer executable program code that inputs a reference reflected power value to the controller;
   computer executable program code that perturbs a matching network of a transmitter system;
   computer executable program code that, responsive to perturbing the matching network, determines a reflected power value; and
   computer executable program code that determines a value of an input impedance of an antenna of the wireless system through convergence of a non-linear optimizer.

7. The wireless communications system of claim 1, wherein the second non-linear equation of the first and second non-linear equations is expressed as:

$$\Gamma_A = \frac{Z_A - Z_0}{Z_A + Z_0}$$

wherein $\Gamma_A$ is the reflection coefficient of the antenna; $Z_A$ is the input impedance of the antenna; and $Z_0$ is the reference input impedance of the antenna.

8. A network server comprising a computer recordable storage medium tangibly embodying computer executable program code, which when executed by a controller, performs actions of:

solving, with a non-linear optimizer, for an input impedance of an antenna by calculating a solution to two non-linear equations, wherein:
a first non-linear equation of the two non-linear equations is expressed as:

$$\Gamma_{in} = S_{11} - \frac{S_{12}S_{21}\Gamma_A}{1 - S_{22}\Gamma_A},$$

wherein $\Gamma_{in}$ is the reflection coefficient of the antenna seen into the matching network, $\Gamma_A$ is the reflection coefficient of the antenna; $S_{11}$ is the input reflection coefficient of a 50 ohm terminated output; $S_{21}$ is the forward transmission coefficient of a 50 ohm terminated output; $S_{12}$ is the reverse transmission coefficient of a 50 ohm terminated input; and $S_{22}$ is the output reflection coefficient of a 50 ohm terminated input; and
tuning a number of reactive elements of a matching network to values that match the input impedance.

9. The network server of claim 8, wherein a second non-linear equation of the two non-linear equations is expressed as:

$$\Gamma_A = \frac{Z_A - Z_0}{Z_A + Z_0},$$

wherein $\Gamma_A$ is the reflection coefficient of the antenna; $Z_A$ is the input impedance of the antenna; and $Z_0$ is the reference input impedance of the antenna.

10. The network server of claim 8, wherein the actions further comprise:
perturbing, with a controller, a number of reactive elements of the matching network, by a value that is a percentage of a current value; and
responsive to the perturbing, determining a first reflected power value.

11. A computer implemented method of matching the input impedance of an antenna, the computer implemented method comprising:
solving, with a non-linear optimizer, for the input impedance of the antenna by calculating a solution to two non-linear equations, wherein a first of said two non-linear equations is expressed as:

$$\Gamma_{in} = S_{11} - \frac{S_{12}S_{21}\Gamma_A}{1 - S_{22}\Gamma_A},$$

wherein $\Gamma_{in}$ is the reflection coefficient of the antenna seen into the matching network, $\Gamma_A$ is the reflection coefficient of the antenna; $S_{11}$ is the input reflection coefficient of a 50 ohm terminated output; $S_{21}$ is the forward transmission coefficient of a 50 ohm terminated output; $S_{12}$ is the reverse transmission coefficient of a 50 ohm terminated input; and $S_{22}$ is the output reflection coefficient of a 50 ohm terminated input; and
tuning, with a controller, a number of reactive elements of a matching network to values that match the input impedance of the antenna to an output impedance of a transmitter system.

12. The computer implemented method of claim 11, wherein a second non-linear equation is expressed as:

$$\Gamma_A = \frac{Z_A - Z_0}{Z_A + Z_0},$$

wherein $\Gamma_A$ is the reflection coefficient of the antenna; $Z_A$ is the input impedance of the antenna; and $Z_0$ is the reference input impedance of the antenna.

13. The computer implemented method of claim 11, wherein the non-linear optimizer solves for the input impedance of the antenna at a quadratic rate of convergence.

14. The computer implemented method of claim 11, further comprising:
perturbing, with the controller, a number of reactive elements of the matching network, by a value that is a percentage of a current value; and
responsive, to the perturbing, determining a first reflected power value.

15. The computer implemented method of claim 14, further comprising:
converting, with a digital-to-analog converter, the input impedance to voltage values that tune the reactive elements of the matching network.

16. The computer implemented method of claim 14, wherein the non-linear optimizer inputs a reference reflected power and a first reflected power to determine the input impedance of the antenna.

* * * * *